United States Patent
Wong et al.

(10) Patent No.: US 6,388,481 B1
(45) Date of Patent: May 14, 2002

(54) OSCILLATOR CONTROL CIRCUITRY FOR PHASE LOCK LOOP PROVIDING ENHANCED PHASE NOISE AND SPURIOUS SIGNAL PERFORMANCE

(75) Inventors: Kim Yeow Wong, Renton; David Lindsay Broughton, Tacoma; Jeffrey Mark Huard, Puyallup, all of WA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/847,129

(22) Filed: May 1, 2001

(51) Int. Cl.[7] .................................................. H03L 7/06
(52) U.S. Cl. ........................ 327/157; 327/170; 327/536
(58) Field of Search ................................. 327/157, 536, 327/589, 148, 170

(56) References Cited

U.S. PATENT DOCUMENTS 5,740,213 A  * 4/1998 Dreyer ........................ 375/374

6,304,467 B1 * 10/2001 Nebrigic ....................... 363/49

* cited by examiner

*Primary Examiner*—Margaret R. Wambach
(74) *Attorney, Agent, or Firm*—Mark A. Dalla Valle; Wildman, Harrold, Allen & Dixon (57) ABSTRACT

Oscillator control circuitry for a phase lock loop, including phase detection circuitry, control signal generator circuitry, bias control circuitry and charge pump circuitry. The control signal generator circuitry introduces specific and distinct time delays to the phase signals from the phase detection circuitry representing the phase difference between the reference and oscillator output signals. These time delays cause the bias control circuitry to enable and disable the output charge pump circuitry slightly before and after, respectively, those time intervals during which an output source ("pump up") or sink ("pump down") current is needed to drive the oscillator via the loop filter. This produces charge pump circuitry output signals with significantly faster rise and fall times and shorter pulse widths, thereby resulting in a charge pump output signal with higher SNR and reduced spurious signal energy.

16 Claims, 6 Drawing Sheets

OSCILLATOR CONTROL CIRCUITRY FOR PHASE LOCK LOOP PROVIDING ENHANCED PHASE NOISE AND SPURIOUS SIGNAL PERFORMANCE

BACKGROUND OF THE INVENTION

1. Field of the Invention

The present invention relates to phase lock loop circuits, and in particular, circuitry within the feedback loop for controlling the oscillator and minimizing phase noise and spurious signal content.

2. Description of the Related Art

Figure 1:
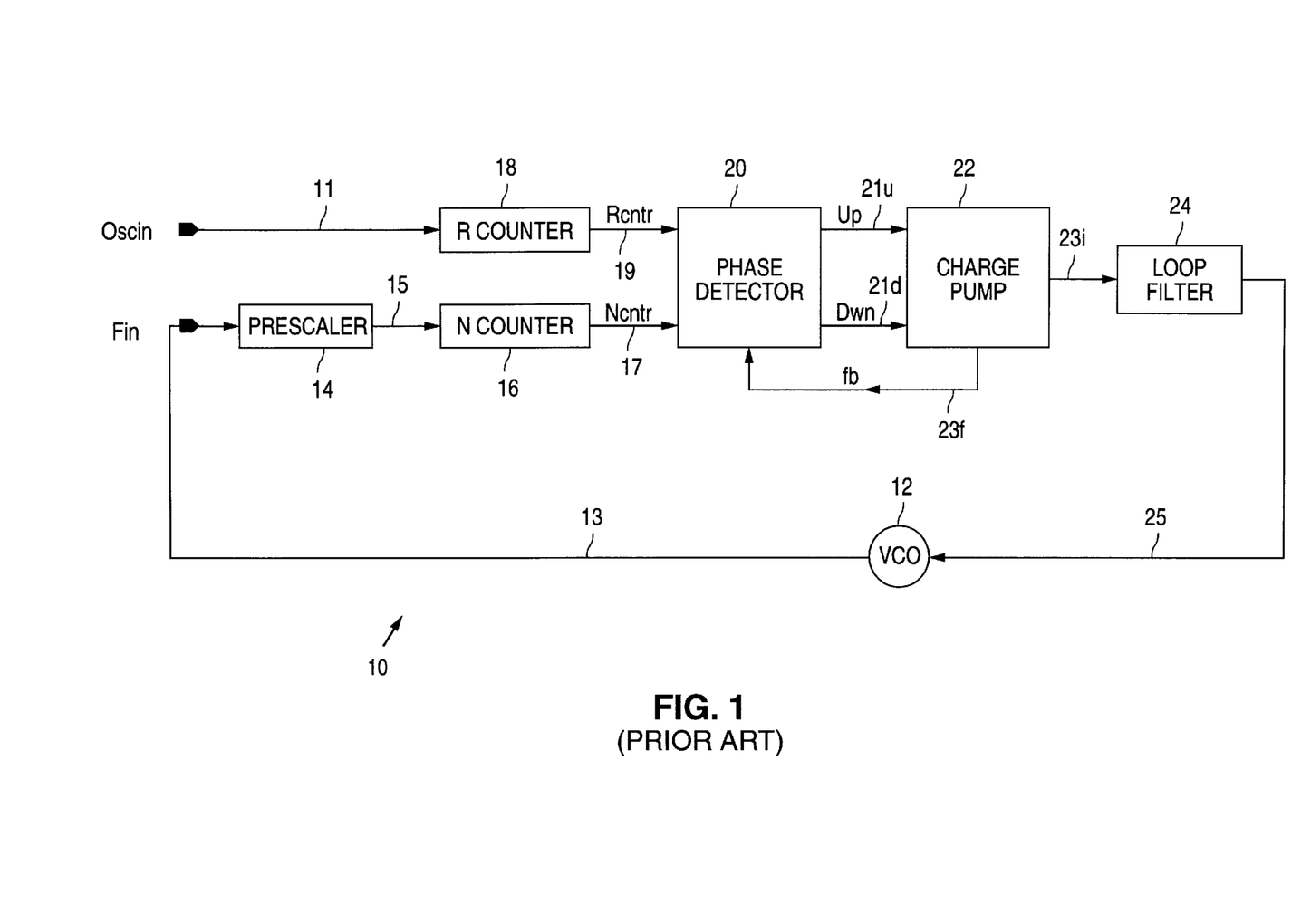
FIG. 1 is a functional block diagram of a conventional phase lock loop circuit.

Referring to FIG. 1, a typical conventional phase lock loop circuit 10 includes an oscillator 12 (typically a voltage-controlled oscillator, or VCO) which is driven by a control signal 25 to produce its oscillator output signal 13. This output signal 13 is fed back to a prescaler 14 which divides down the frequency of this signal 13. The reduced frequency signal 15 is then further divided down by a counter 16 having a programmable divisor N. The final frequency-divided signal 17 is provided to a phase detector 20.

A reference signal 11 provided by an external reference oscillator (not shown) is divided down in frequency by another counter 18 having another programmable divisor R. The resultant frequency-divided signal 19 is also provided to the phase detector 20. The phase detector 20 compares the relative phases of these two signals 17, 19, using the frequency-divided reference signal 19 as the "target" with respect to the desired phase of the feedback signal 17. (This phase comparison is done in accordance with well-known conventional techniques and hence need not be described further here.) Based upon this phase comparison, the phase detector provides two phase signals 21u, 21d. One of the signals 21u is asserted when it is necessary to increase the frequency of the feedback signal 17 in order to have its phase match that of the reference signal 19. The other signal 21d is asserted when it is necessary for the frequency of the feedback signal 17 to be decreased in frequency so as to have its signal phase match that of the reference signal 19.

These two phase signals 21u, 21d are provided to a charge pump circuit 22 (discussed in more detail below) which provides an output current signal 23i and a feedback signal 23f. The output current signal 23i is used to "pump up" or "pump down" the electrical charge stored by a capacitor (not shown) within the loop filter circuit 24 in accordance with well known conventional techniques. As a result of this stored electrical charge, the loop filter 24 provides the control signal 25 for the oscillator 12. The feedback signal 23f is used to control the assertion and deassertion of the phase signals 21u, 21d generated by the phase detector 20.

Figure 2:
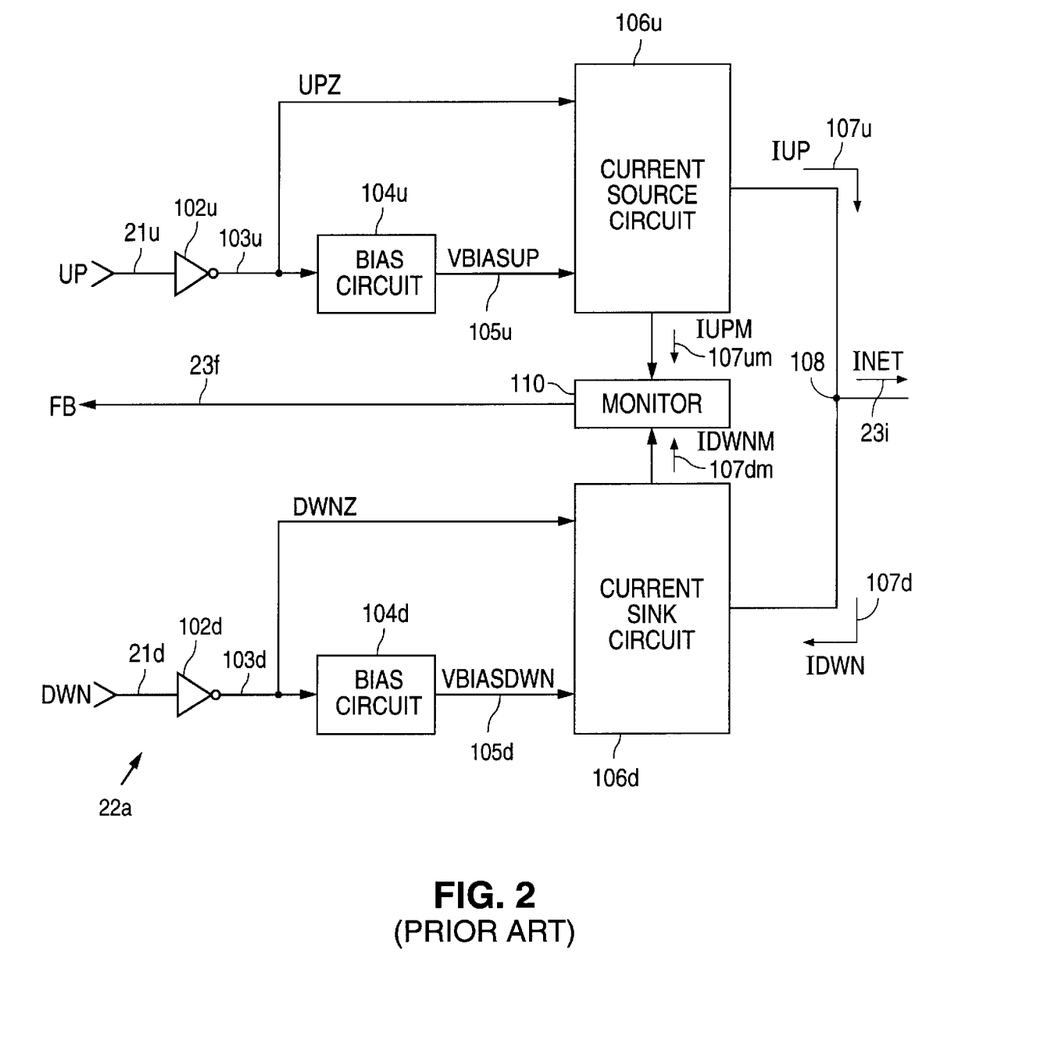
FIG. 2 is a functional block diagram of a conventional charge pump circuit for use in the circuit of FIG. 1.

Referring to FIG. 2, a conventional embodiment 22a of the charge pump 22 (FIG. 1), includes an input buffer 102u/102d, such as an inverter, a bias circuit 104u/104d and a current source circuit 106u/106d for each of the "pump up" and "pump down" signal channels. For each channel, the incoming signal 21 is buffered and inverted by the inverter 102u/102d. The resulting inverted input signal 103u/103d drives the bias circuit 104u/104d and the current source circuit 106u/106d. Assertion of this signal 103u/103d causes the bias circuit 104u/104d to generate a bias signal 105u/105d. Coincident assertions of this inverted input signal 103u/103d and bias signal 105u/105d cause the current source circuit 106u/106d to generate its output current 107u/107d. For the "pump up" channel, the output signal 107u is a source current, while for the "pump down" channel, the output current 107d is a sink current. These source 107u and sink 107d currents sum at the output note 108 to produce the net, or composite, output current 23i.

Figure 3:
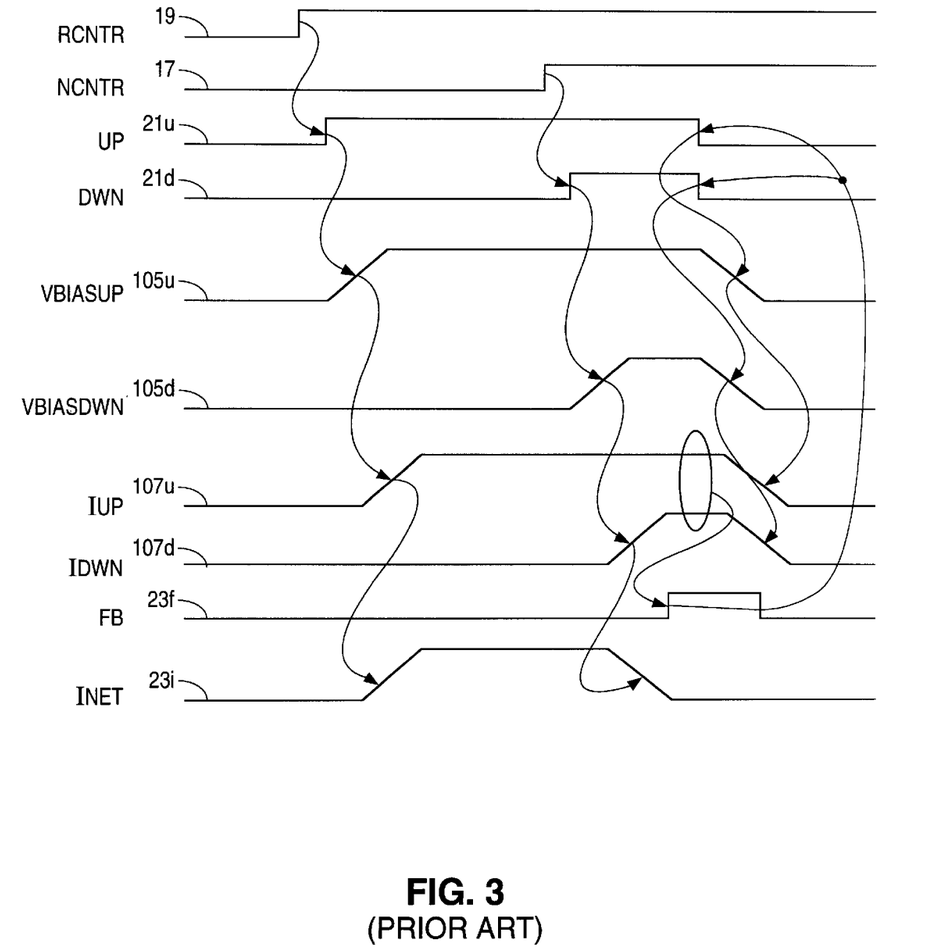
FIG. 3 is a signal timing diagram for the signals associated with the circuitry of FIG. 2.

Referring to FIG. 3 (in conjunction with FIG. 2), it can be seen that during a charge pump event (either pump up or pump down) the bias 104u/104d and current source (or sink) 106u/106d circuitry are both enabled by their corresponding phase signal 21 and bias signal 105u/105d. However, the bias circuitry 104u/104d takes a longer interval of time to become fully enabled, or turned on, than the current source (or sink) circuitry 106u/106d. And, since the bias circuitry 104u/104d must be turned on before the current source (or sink) circuitry 106u/106d can effectively generate its output current 107u/107d and thereby provide the appropriate charge to the loop filter 24 (FIG. 1), the leading and trailing edges of the output current 23i waveform are dictated by how fast the bias circuitry 104u/104d turns on. Hence, the net output current 23i has slow rise and fall times which cause the output current signal 23i to have significant low frequency signal components. These low frequency signal components cannot be effectively filtered out by the lowpass loop filter 24. As a result, these low frequency signal components appear as phase noise or spurious signals within the output signal 13 from the oscillator 12 (FIG. 1).

As noted above, the feedback signal 23f determines when the phase signals 21u, 21d from the phase detector 20 are deasserted. Upon coincident assertion of the output source 107u and sink 107d currents, the feedback signal 23f is asserted, following which the phase signals 21u, 21d from the phase detector 20 are deasserted. Such coincident assertions of the source 107u and sink 107d currents are detected by a monitor circuit 110 which monitors these currents (in a conventional manner) to produce the feedback signal 23f.

Accordingly, it would be desirable to have an oscillator control circuit capable of generating charge pump current signals with significantly reduced low-frequency signal components so as to minimize in-band phase noise and spurious signals associated with such low-frequency signal components.

SUMMARY OF THE INVENTION

An oscillator control circuit for a phase lock loop in accordance with one embodiment of the present invention provides source and sink currents at the output of the charge pump circuitry with high slew rates. The fast rise and fall times of the waveforms for these current signals cause minimal low-frequency signal components to be included in the frequency spectrum of the output signals. Instead, any harmonics or other signal components associated with these waveforms occur at significantly higher frequencies, thereby allowing them to be filtered out by the loop filter before reaching the oscillator. Additionally, these fast rise and fall times for the current signal pulses cause such signal pulses to be of shorter durations, thereby minimizing the amount of spurious signal energy being produced. Furthermore, these fast signal pulse edges translate into a higher effective charge pump output signal relative to the noise, thereby resulting in an increased signal-to-noise ratio (SNR) and hence an improvement in phase noise. Hence, in-band phase noise and spurious signal content are significantly reduced.

An apparatus including oscillator control circuitry for a phase lock loop in accordance with one embodiment of the present invention includes phase detection circuitry, control signal generator circuitry, bias control circuitry and charge pump circuitry. The phase detection circuitry, responsive to a reference signal, an oscillator feedback signal and a charge pump feedback signal, provides first and second phase signals indicative of a phase difference between the reference and oscillator feedback signals with respective assertion states responsive to the phase difference and respective deassertion states responsive to the charge pump feedback signal. The control signal generator circuitry, coupled to the phase detection circuitry and responsive to the first and second phase signals, provides: a first pump control signal with assertion and deassertion states corresponding to and time-delayed from the first phase signal assertion and deassertion states; a first bias control signal with assertion and deassertion states responsive to the first phase signal and the first pump control signal; a second pump control signal with assertion and deassertion states corresponding to and time-delayed from the second phase signal assertion and deassertion states; and a second bias control signal with assertion and deassertion states responsive to the second phase signal and the second pump control signal. The bias control circuitry, coupled to the control signal generator circuitry and responsive to the first and second bias control signals, provides first and second bias enablement signals with assertion and deassertion states. The charge pump circuitry, coupled to the bias control circuitry and the control signal generator circuitry and responsive to the first and second bias enablement signals and the first and second pump control signals, provides a composite output current signal and the charge pump feedback signal, wherein: the composite output current signal includes an output source current component substantially coincident with the first bias enablement and pump control signal assertion states and includes an output sink current component substantially coincident with the second bias enablement and pump control signal assertion states; and the charge pump feedback signal includes an assertion state responsive to a coincidence of the output source and sink current components.

DETAILED DESCRIPTION OF THE INVENTION

Figure 4:
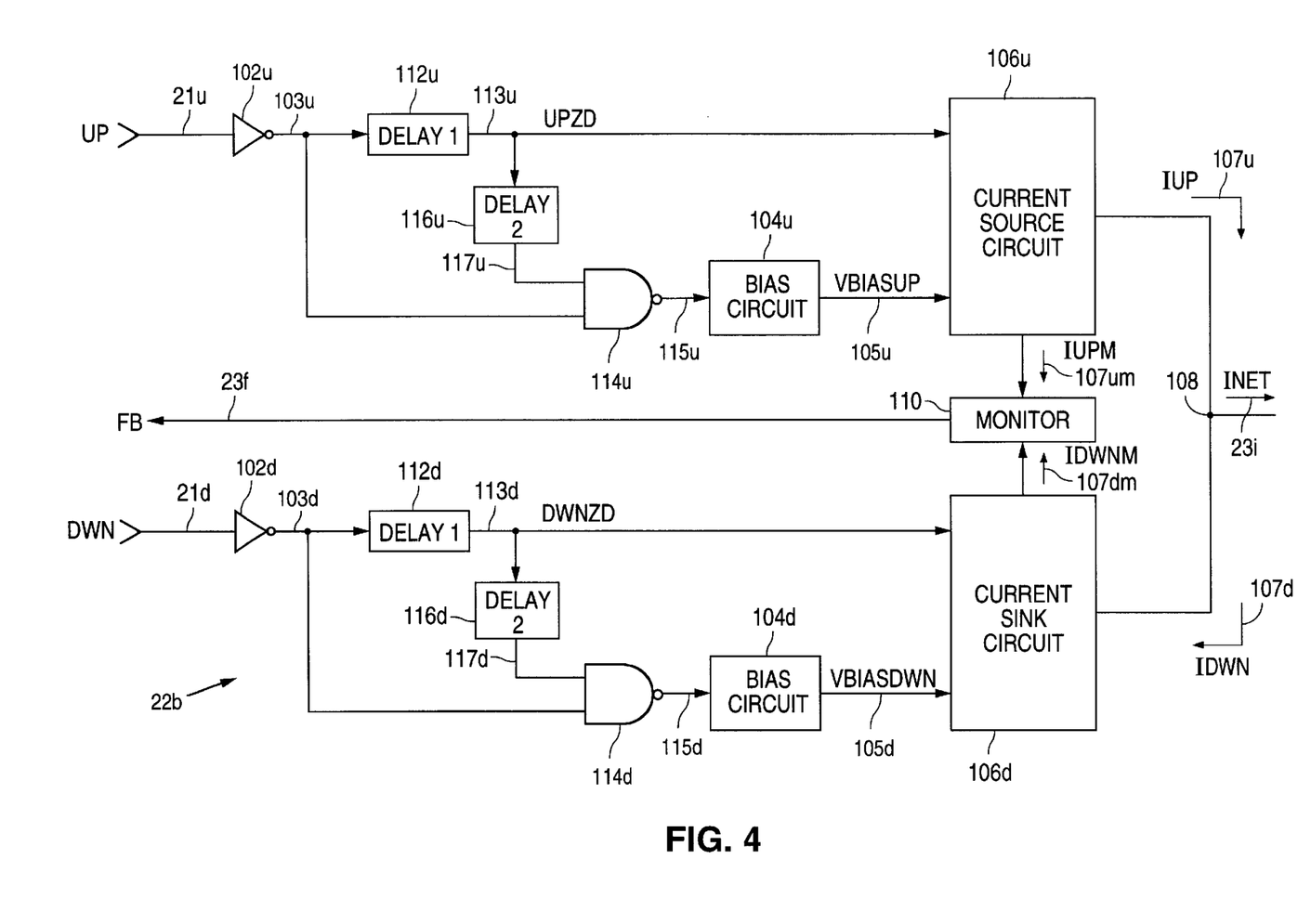
FIG. 4 is a functional block diagram of a charge pump circuit in accordance with one embodiment of the present invention.

Referring to FIG. 4, a charge pump circuit 22b in accordance with one embodiment of the present invention includes a number of additional circuit elements (as compared to the circuit of FIG. 2) for significantly improving the slew rates associated with the output source 107u and sink 107d currents. In this circuit 22b, each buffered and inverted signal 103u/103d is delayed by a delay circuit 112u/112d which imparts a time delay having a duration of "delay1" to produce a delayed phase signal 113u/i 13d. The delayed phase signal 113u/113d is further delayed by another delay circuit 116u/116d which imparts an additional time delay having a duration of "delay2" to produce a further delayed phase signal 117u/117d. Both the non-delayed 103u/103d and further delayed 117u/117d signals are logically processed by a NAND gate 114u/114d to produce the control signal 115u/115d for the bias circuit 104u/104d. The resulting bias control signal 105u/105d and the delayed phase signal 113u/113d enable and control the current source (or sink) circuit 106u/106d.

The delay circuits 112u, 112d, 116u, 116d can be implemented using any of a number of well known conventional design techniques. For example, each delay circuit 112u, 112d, 116u, 116d can be implemented using a set of serially connected logic inverters which successively invert and re-invert the input signal, thereby imposing a finite time delay with each such successive signal inversion. Other implementations can involve the use of circuits formed with transistors that are specifically designed to be "slow" so as to impart the desired signal delay, or a sequence of flip-flop circuits to impart a sequence of discrete time delays corresponding to each flip-flop circuit.

Figure 5:
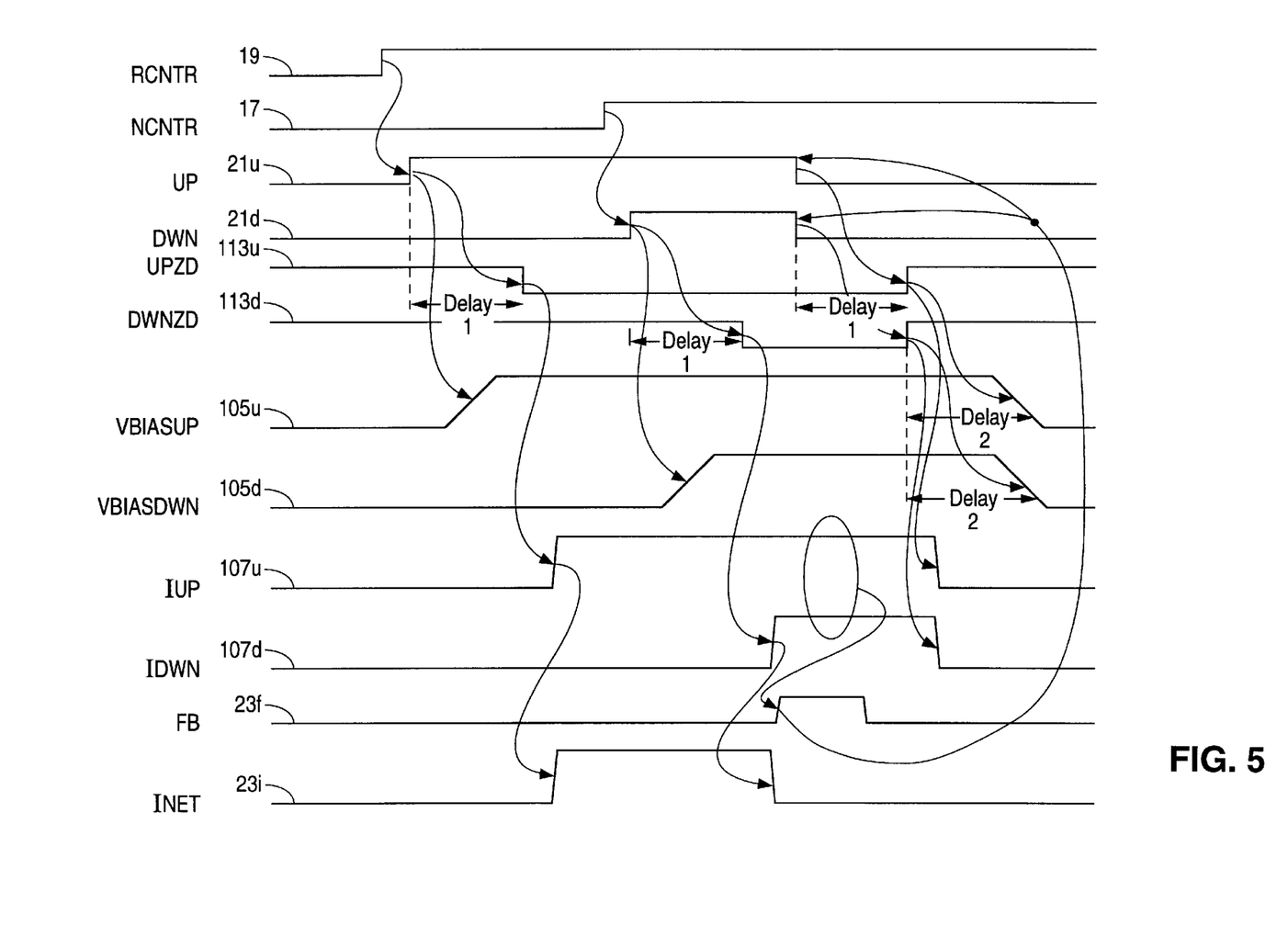
FIG. 5 is a signal timing diagram for the signals associated with the circuitry of FIG. 4.

Referring to FIG. 5 in conjunction with FIG. 4, achievement of increased slew rates for the output current signals 107u/l 07d can be better understood. As depicted, assertions of the reference counter 19 and feedback counter 17 signals cause the "UP" 21u and "DWN" 21d phase signals to be asserted. In turn, this causes the as signals 105u, 105d from the bias circuits 104u, 104d to begin slewing to their respective asserted signal states immediately. Following the delay interval "delay1", the delayed phase signals 113u, 113d become asserted. By then, the bias control signals 105u, 105d have fully enabled the current source 106u and sink 106d circuits. Hence, the assertions of the delayed phase signals 113u, 113d thereby cause the source 107u and sink 107d current signals to become asserted immediately with correspondingly high slew rates. As noted above, these currents 107u, 107d sum at the output node 108 to produce the net, or composite, output current 23i, as shown.

Following coincident assertions of both the source 107u and sink 107d current signals, the monitor circuit 110 causes the feedback signal 23f to become asserted as well. This, in turn, causes the original phase signals 21u, 21d to be deasserted. Following deassertion of these phase signals 21u, 21d, and after the delay interval "delay1," the delayed phase signals 113u, 113d return to their respective deasserted states. Following the second delay interval "delay2", the bias control signals 105u, 105d also return to their respective deasserted states.

Hence, with reference again to FIG. 5, the increased slew rates of the rising and falling edges, i.e., decreased rise and fall times, of the net output current 23i results in minimal low-frequency phase noise and spurious signal content within such signal 23i. The earlier assertions and later deassertions of the bias control signals 105u, 105d, relative to the assertions and deassertions of the delayed phase signals 113u, 113d, respectively, allow the output current source 106u and sink 106d circuits to respond more rapidly to the delayed phase signals 113u, 113d. This allows the output current source 106u and sink 106d circuits to turn on and off more quickly, thereby producing source 107u and sink 107d current pulses (and, therefore, a net output current 23i pulse) with faster pulse edges. These faster edges increase the effective charge pump output signal 23i relative to the noise, thereby producing an increased SNR (in terms of phase noise). These faster signal pulse edges also result in narrower, i.e., shorter, source 107u, sink 107d and net output 23i current pulses with the same amount of electrical charge delivered by such pulses. This reduces the amount of spurious output signal energy being produced due to the reduced net output current 23*i* mismatch (resulting from concurrent assertion states of the source 107*u* and sink 107*d* current pulses).

Figure 6:
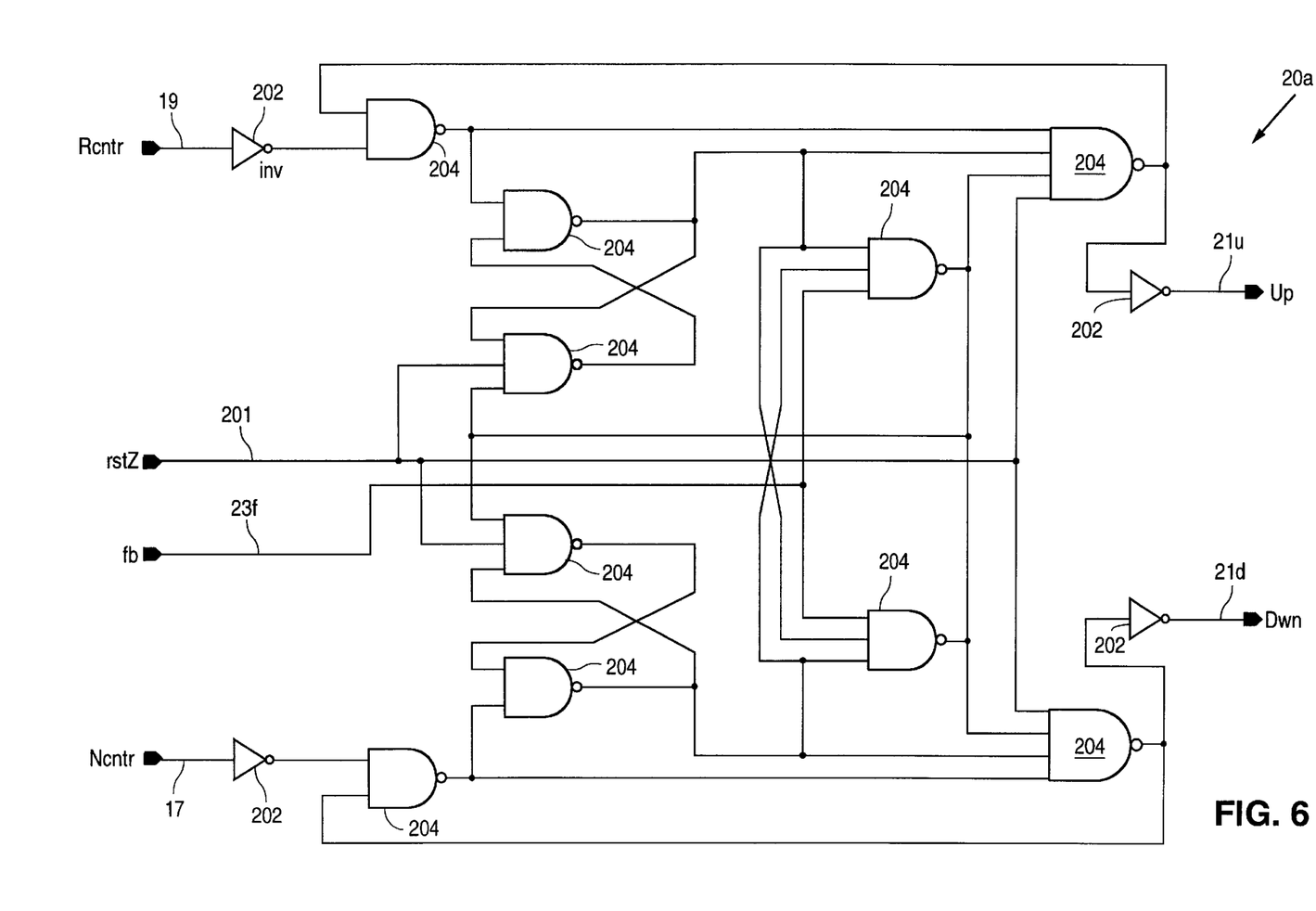
FIG. 6 is a schematic diagram of one embodiment of a phase detector circuit suitable for use with the charge pump circuit in accordance with the present invention.

Referring to FIG. 6, one embodiment of a phase detector 20*a* suitable for use with the charge pump circuitry 22*b* (FIG. 4) can be implemented as shown. Inverters 202 provide buffering for the input 17, 19, and output 21*u*, 21*d* signals, while multiple cross-coupled NAND gates 204 logically process the input signals 17, 19 to produce the appropriate phase signals 21*u*, 21*d* in accordance with the feedback signal 3*f*, as well as reset signal 201.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including oscillator control circuitry for a phase lock loop, comprising:

phase detection circuitry, responsive to a reference signal, an oscillator feedback signal and a charge pump feedback signal, that provides first and second phase signals indicative of a phase difference between said reference and oscillator feedback signals with respective assertion states responsive to said phase difference and respective deassertion states responsive to said charge pump feedback signal;

control signal generator circuitry, coupled to said phase detection circuitry and responsive to said first and second phase signals, that provides a first pump control signal with assertion and deassertion states corresponding to and time-delayed from said first phase signal assertion and deassertion states, a first bias control signal with assertion and deassertion states responsive to said first phase signal and said first pump control signal, a second pump control signal with assertion and deassertion states corresponding to and time-delayed from said second phase signal assertion and deassertion states, and a second bias control signal with assertion and deassertion states responsive to said second phase signal and said second pump control signal;

bias control circuitry, coupled to said control signal generator circuitry and responsive to said first and second bias control signals, that provides first and second bias enablement signals with assertion and deassertion states; and charge pump circuitry, coupled to said bias control circuitry and said control signal generator circuitry and responsive to said first and second bias enablement signals and said first and second pump control signals, that provides a composite output current signal and said charge pump feedback signal, wherein said composite output current signal includes an output source current component substantially coincident with said first bias enablement and pump control signal assertion states and includes an output sink current component substantially coincident with said second bias enablement and pump control signal assertion states, and said charge pump feedback signal includes an assertion state responsive to a coincidence of said output source and sink current components.

2. The apparatus of claim 1, wherein said phase detection circuitry comprises a plurality of mutually coupled logic circuits that, responsive to said charge pump feedback signal, process said reference signal and said oscillator feedback signal to generate said first and second phase signals.

3. The apparatus of claim 1, wherein said control signal generator circuitry comprises:

a first delay circuit that delays said first phase signal to generate said first pump control signal;

a first logic circuit that processes said first phase signal and said first pump control signal to generate said first bias control signal;

a second delay circuit that delays said second phase signal to generate said second pump control signal; and a second logic circuit that processes said second phase signal and said second pump control signal to generate said second bias control signal.

4. The apparatus of claim 1, wherein said first and second logic circuits comprise:

third and fourth delay circuits that delay said first and second pump control signals to generate first and second delayed signals, respectively;

first and second logic gate circuits that process said first and second delayed signals and said first and second phase signals to generate said first and second bias control signals, respectively.

5. The apparatus of claim 1, wherein said bias control circuitry comprises:

a first bias generator circuit that, responsive to said first bias control signal, generates a first power signal as said first bias enablement signal; and a second bias generator circuit that, responsive to said second bias control signal, generates a second power signal as said second bias enablement signal.

6. The apparatus of claim 1, wherein said charge pump circuitry comprises:

a current source circuit that, responsive to said first bias enablement signal and said first pump control signal, generates said output source current component;

a current sink circuit that, responsive to said second bias enablement signal and said second pump control signal, generates said output sink current component; and a current monitoring circuit, coupled to said current source and sink circuits, responsive to said output source and sink current components, that generates said charge pump feedback signal.

7. The apparatus of claim 1, further comprising divider circuitry that receives and divides an oscillator output signal to provide said oscillator feedback signal.

8. The apparatus of claim 1, further comprising filter circuitry that filters said composite output current signal.

9. An apparatus including oscillator control circuitry for a phase lock loop, comprising:

phase detector means for receiving a reference signal, an oscillator feedback signal and a charge pump feedback signal and in response thereto generating first and second phase signals indicative of a phase difference between said reference and oscillator feedback signals with respective assertion states responsive to said phase difference and respective deassertion states responsive to said charge pump feedback signal;

control signal generator means for receiving said first and second phase signals and in response thereto generating
- a first pump control signal with assertion and deassertion states corresponding to and time-delayed from said first phase signal assertion and deassertion states,
- a first bias control signal with assertion and deassertion states responsive to said first phase signal and said first pump control signal,
- a second pump control signal with assertion and deassertion states corresponding to and time-delayed from said second phase signal assertion and deassertion states, and
- a second bias control signal with assertion and deassertion states responsive to said second phase signal and said second pump control signal;

bias controller means for receiving said first and second bias control signals and in response thereto generating first and second bias enablement signals with assertion and deassertion states; and charge pump means for receiving said first and second bias enablement signals and said first and second pump control signals and in response thereto generating a composite output current signal and said charge pump feedback signal, wherein
- said composite output current signal includes an output source current component substantially coincident with said first bias enablement and pump control signal assertion states and includes an output sink current component substantially coincident with said second bias enablement and pump control signal assertion states, and
- said charge pump feedback signal includes an assertion state responsive to a coincidence of said output source and sink current components.

10. The apparatus of claim 9, wherein said phase detector means comprises a plurality of mutually coupled logic means for receiving said charge pump feedback signal and in response thereto processing said reference signal and said oscillator feedback signal and in response thereto generating said first and second phase signals.

11. The apparatus of claim 9, wherein said control signal generator means comprises:
first delay means for delaying said first phase signal and in response thereto generating said first pump control signal;

first logic means for processing said first phase signal and said first pump control signal and in response thereto generating said first bias control signal;

second delay means for delaying said second phase signal and in response thereto generating said second pump control signal; and second logic means for processing said second phase signal and said second pump control signal and in response thereto generating said second bias control signal.

12. The apparatus of claim 1, wherein said first and second logic means comprise:
third and fourth delay means for delaying said first and second pump control signals and in response thereto generating first and second delayed signals, respectively;

first and second logic gate means for processing said first and second delayed signals and said first and second phase signals and in response thereto generating said first and second bias control signals, respectively.

13. The apparatus of claim 9, wherein said bias controller means comprises:
first bias generator means for receiving said first bias control signal and in response thereto generating a first power signal as said first bias enablement signal; and second bias generator means for receiving said second bias control signal and in response thereto generating a second power signal as said second bias enablement signal.

14. The apparatus of claim 9, wherein said charge pump means comprises:
current source means for receiving said first bias enablement signal and said first pump control signal and in response thereto generating said output source current component;

current sink means for receiving said second bias enablement signal and said second pump control signal and in response thereto generating said output sink current component; and current monitoring means for monitoring said output source and sink current components and in response thereto generating said charge pump feedback signal.

15. The apparatus of claim 9, further comprising divider means for receiving and dividing an oscillator output signal and in response thereto generating said oscillator feedback signal.

16. The apparatus of claim 9, further comprising filter means for filtering said composite output current signal.

* * * * *